(12) United States Patent
Lin et al.

(10) Patent No.: US 7,671,619 B2
(45) Date of Patent: Mar. 2, 2010

(54) MEASURING SYSTEM AND METHOD

(75) Inventors: Wei-Cheng Lin, Hsinchu (TW);
Cheng-Ho Yu, Yuanlin Township, Changhua County (TW)

(73) Assignee: TPO Displays Corp., Miaooli Country (TW)

( * ) Notice: Subject to any disclaimer, the term of this patent is extended or adjusted under 35 U.S.C. 154(b) by 30 days.

(21) Appl. No.: 12/211,264

(22) Filed: Sep. 16, 2008

(65) Prior Publication Data

US 2009/0074154 A1 Mar. 19, 2009

(30) Foreign Application Priority Data

Sep. 17, 2007 (TW) .............................. 96134705 A

(51) Int. Cl.
*G01R 31/26* (2006.01)
(52) U.S. Cl. ...................................... 324/765
(58) Field of Classification Search ................. 324/763, 324/765, 158.1, 76.11; 327/78, 58, 50, 97; 323/282; 716/12; 331/2; 361/93.3
See application file for complete search history.

(56) References Cited

U.S. PATENT DOCUMENTS 6,028,438 A * 2/2000 Gillette ........................ 324/765
7,489,125 B2 * 2/2009 Hauptman ................ 324/158.1

* cited by examiner

*Primary Examiner*—Ha Tran Nguyen
*Assistant Examiner*—Tung X Nguyen
(74) *Attorney, Agent, or Firm*—Thomas, Kayden, Horstemeyer & Risley LLP

(57) ABSTRACT

A measuring system comprises a pulse generator, an under test device, a variable resistor and a detecting control system. The pulse generator provides pulse signals with different voltage peaks to the under test device and the variable resistor. The variable resistor adjusts its resistance value according to a control signal. The detecting control system detects the voltage ringing ranges of the first terminal of the under test device at different resistance values. The detecting control system generates the control signal to adjust the resistance value of the variable resistor according to the voltage ringing ranges.

16 Claims, 4 Drawing Sheets

MEASURING SYSTEM AND METHOD

CROSS REFERENCE TO RELATED APPLICATIONS

This application claims priority of Taiwanese Patent Application Serial No. 096134705, filed on Sep. 17, 2007, the entirety of which is incorporated by reference herein.

BACKGROUND OF THE INVENTION

1. Field of the Invention

The invention relates to an electrostatic measuring system, and in particular relates to an electrostatic measuring system capable of automatically matching impedance.

2. Description of the Related Art

Thin film transistors are disposed on a glass substrate. Due to an adhesion problem, the thickness of the thin film transistors on glass is required to be below a specific thickness. In addition, size trends for the thin film transistors are smaller and smaller. However, smaller sizes make the thin film transistors very sensitive to electrostatic discharge effect. Accordingly, electrostatic discharge damage is a common problem for the thin film transistors. Thus, to test the maximum electrostatic voltage level that the thin film transistors can endure is important.

BRIEF SUMMARY OF THE INVENTION

A detailed description is given in the following embodiments with reference to the accompanying drawings.

An embodiment of a measuring system is provided. The measuring system comprises a pulse generator, an under test device, a variable resistor and a detecting control system. The pulse generator provides pulse signals with different voltage levels. The under test device is coupled to the pulse generator to receive the pulse signals. The variable resistor is coupled to the under test device and adjusts its resistance value according to a control signal. The detecting control system detects voltage ringing ranges of a first terminal of the under test device at different impedances and generates the control signal to adjust the resistance value of the variable resistor according to the voltage ringing ranges.

The pulse signal generator comprises a voltage supply, a first transmission line, a second transmission line, a diode and a switch device. The voltage supply provides a direct voltage. The first transmission line and the second transmission line have the same characters of impedance. The diode is coupled to the first transmission line and the second transmission line. The switch device has a first terminal and a second terminal, wherein the first terminal is coupled to the first transmission line. The switch device makes the second terminal coupled to the second transmission line or the voltage supply according to a switching signal.

Another embodiment of a measuring method is provided. The method comprises: generating a pulse signal to an under test device and a variable resistor, wherein the variable resistor adjusts its resistance value according to a control signal; detecting voltage ringing ranges of a first terminal of the under test device at different resistance value; generating the control signal to adjust the resistance value of the variable resistor according to the voltage ringing ranges so that a ratio of a first voltage ringing range ($V\_ring_{i+1}$) to a second voltage ringing range ($V\_ring_i$) is smaller than a specific value.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
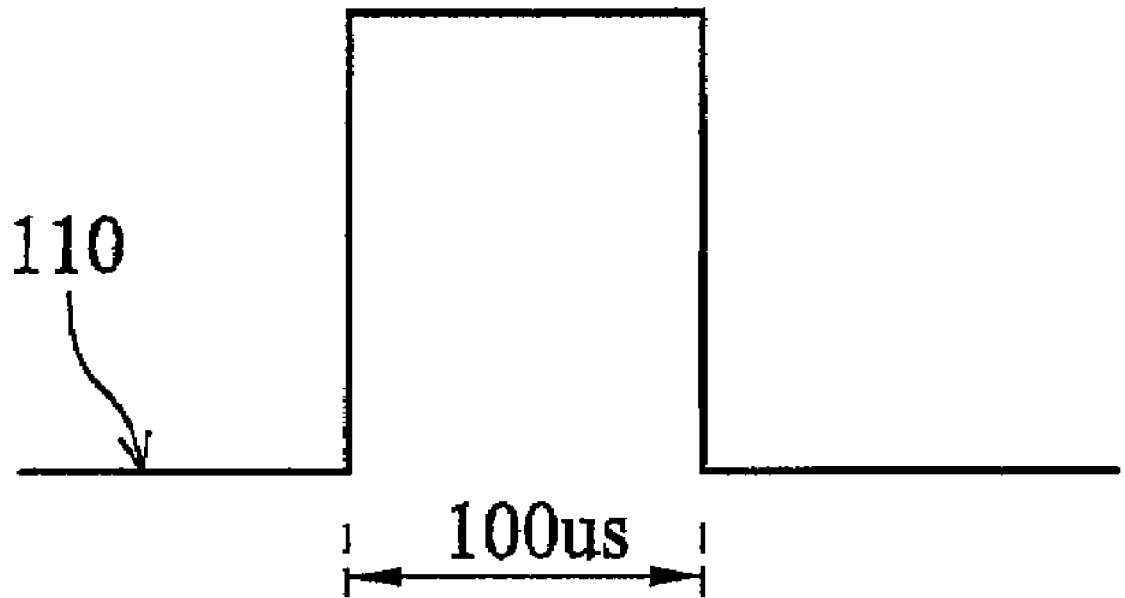
FIG. 1 shows an electrostatic signal in a human body mode.

FIG. 1 shows an electrostatic pulse signal 110 in a human body mode. The wavelength of the electrostatic pulse signal 110 is very short, about 100 ns. However, the voltage level of the electrostatic pulse signal 110 is very high. Thus, semiconductor devices, such as thin film transistors, are often damaged by the electrostatic discharge effect. The objective of the invention is to identify the maximum electrostatic voltage level that can be endured by semiconductor devices. Since thin film transistors are very small, the impedance of the thin film transistors is higher than the characteristic impedance of the transmission lines. Thus, matching impedances between the thin film transistors (semiconductor devices or under test devices) and the transmission lines are required to reduce voltage oscillation effects and reflective waves.

Figure 2:
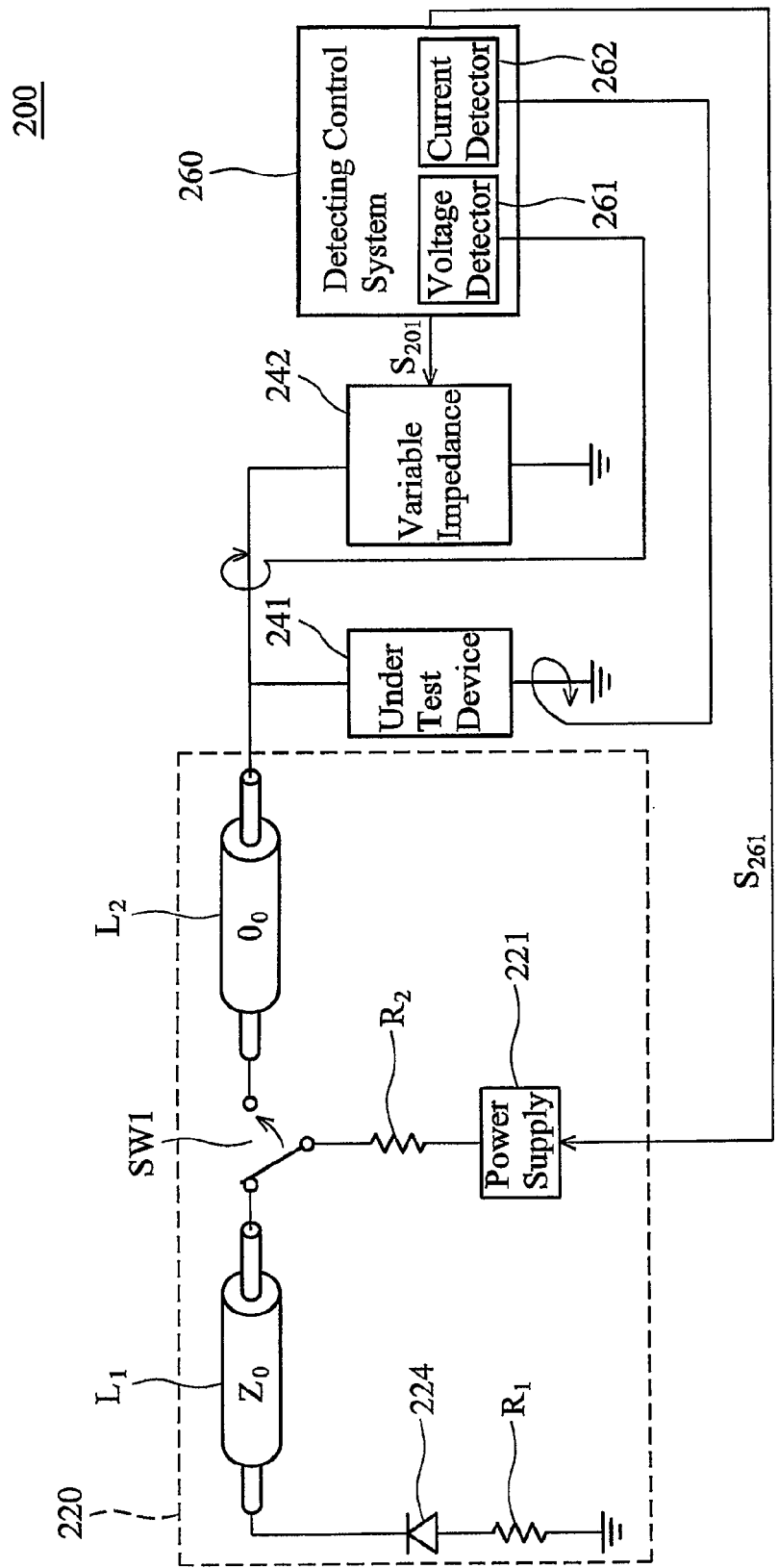
FIG. 2 shows an electrostatic measuring system according to an embodiment of the invention.

FIG. 2 shows an electrostatic measuring system 200 according to an embodiment of the invention. The electrostatic measuring system 200 can be used to measure electrostatic characters of inside devices of a liquid crystal display system. The electrostatic measuring system comprises a pulse generator 220, an under test device 241, a variable resistor 242 and a detecting control system 260. The under test device 241 can be a thin film transistor. The variable resistor 241 can be a voltage variable resistor. The variable resistor 242 and the under test device 241 are coupled in parallel. However, the method is not limited. The variable resistor 242 and the under test device 241 can be coupled in serial.

Figure 3:
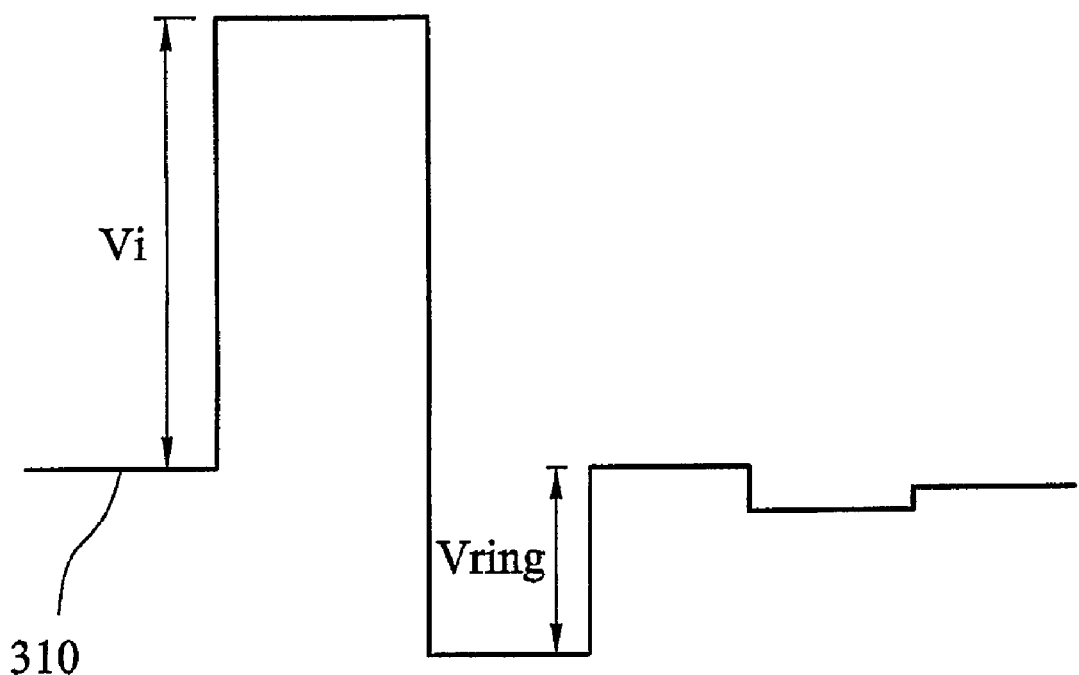
FIG. 3 shows a voltage signal according to an embodiment of the invention.

The detecting control system 260 further comprises a voltage detector 261 and a current detector 262. The pulse generator 220 can provide different peak voltages to the under test device 241 and the variable resistor 242. The variable resistor 242 adjusts its resistance value according to a control signal $S_{201}$ from the detecting control system 260. The voltage detector 261 of the detecting control system 260 detects a voltage ringing range ($V\_ring$) at one terminal of the under test device 241. Because of impedance mismatch, there is a voltage ringing effect on a terminal of the under test device 241, as shown in FIG. 3. The detecting control system 260 generates the control signal $S_{201}$ to adjust the resistance value of the variable resistor 242 to reduce the voltage ringing range ($V\_ring$) based on the voltage ringing range.

The pulse generator 220 comprises a voltage supply 221, transmission lines $L_1$ and $L_2$, a diode 224, a switch device SW1 and resistors $R_1$ and $R_2$. The impedances of the transmission lines $L_1$ and $L_2$ are the same as the impedance of the resistor $R_1$, such as 50 ohm. The voltage supply 221 generates a fixed dc voltage. The switch device SW1 is coupled to one terminal of the transmission line $L_1$. The switch device SW1 switches between the voltage supply 221 and the transmission line $L_2$ to generate a pulse signal according to a switch signal S261. And, the width of the pulse signal is decided by the length of the transmission line $L_1$.

FIG. 3 shows a voltage signal 310 according to an embodiment of the invention. The pulse generator 220 generates a pulse signal to the under test device 241 and the variable resistor 242 and the voltage signal 310 is detected by the voltage detector 261. The voltage ringing range is defined as a voltage difference $V_{ring}$ between the first sub-peak and the second sub-peak at one terminal of the under test device, as shown in FIG. 3. The pulse generator 220 can generate pulse signals with different voltage levels. The electrostatic measuring system 200 outputs different pulse signal with different voltage levels to get the maximum electrostatic voltage levels that the under test device 241 can endure.

Figure 4:
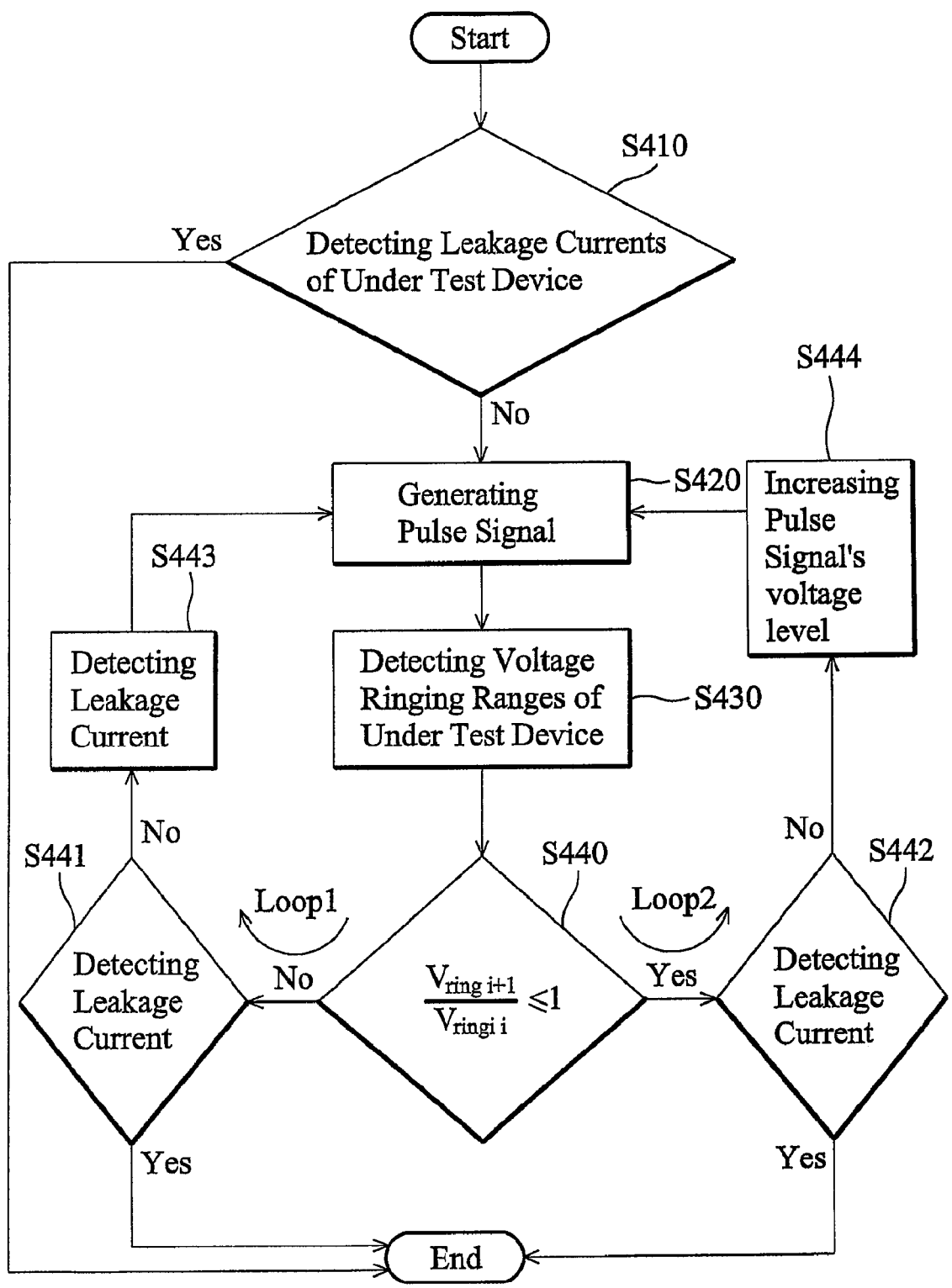
FIG. 4 shows a flow chart of an electrostatic measuring method according to another embodiment of the invention.

FIG. 4 shows a flow chart of an electrostatic measuring method according to another embodiment of the invention. Refer to FIGS. 2 and 4 simultaneously, wherein the current detector 262 of the detecting control system 260 detects a leakage current of the under test device 241 (Step S410). If there is no leakage current, the pulse generator 220 generates a pulse signal with width 100 ns to the under test device 241 and the voltage variable resistor 242 (Step S420). The voltage detector 261 detects the voltage ringing range $V_{ring}$ of one terminal of the under test device 241 at different resistance value (Step S430). The variable resistor 242 adjusts its resistance value according to the control signal $S_{201}$ so that the ratio of the voltage ringing range $V_{ringi+1}$ to the voltage ringing range $V_{ringi}$ is smaller than a specific value, which can be one (Step S440). The voltage ringing range $V_{ringi+1}$ is the voltage ringing range after the variable resistor 242 is adjusted and the voltage ringing range $V_{ringi}$ is the voltage ringing range before the variable resistor 242 is adjusted.

When the ratio of the voltage ringing range $V_{ringi+1}$ to the voltage ringing range $V_{ringi}$ is not smaller than a specific value (loop 1), the detecting control system 260 detects the current of another terminal of the under test device to judge whether there is a leakage current or not, according to another embodiment of the invention, the leakage current can be defined as a current bigger than one in a millionth amp (1 μA), meaning that the equivalent impedance of the voltage variable impedance 242 and the under test device 241 does not match the impedance of the transmission line $L_2$, the detecting control system 260 detects whether the leakage current occurs at another terminal of the under test device 241 or not (Step S441). For example, the leakage current is defined. When the detecting control system 260 detects that there is no leakage current flowing from the under test device 241, the voltage variable impedance 242 adjusts its resistance according to the control signal $S_{201}$ (Step S443). The electrostatic measuring system 200 regenerates a new pulse signal (Step S420) for detecting a new voltage ringing range.

When the equivalent resistance of the voltage variable resistor 242 and the under test device 241 matches the transmission line $L_2$, the ratio of the voltage ringing range $V_{ringi+1}$ to the voltage ringing range $V_{ringi}$ is smaller than one (loop 2). The detecting control system 260 detects the current at another terminal of the under test device 241 to judge whether there is a leakage current or not (Step S442). According to another embodiment of the invention, the leakage current is defined as a current bigger than one in a millionth amp (1 μA). When the detecting control system 260 detects that there is no leakage current flowing from the under test device 241, the pulse generator 220 increases the voltage level of the pulse signal (Step S444) until the detecting control system 260 detects flowing leakage current from the under test device 241. Thus, the electrostatic measuring system 200 can identify the maximum electrostatic voltage level that can be endured by the under test device 241.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A measuring system, comprising
   a pulse generator for providing pulse signals with different voltage levels;
   an under test device coupled to the pulse generator to receive the pulse signals;
   a variable resistor coupled to the under test device and adjusted its resistance value according to a control signal;
   a detecting control system detecting voltage ringing ranges of a first terminal of the under test device at different resistance value and generating the control signal to adjust the resistance value of the variable resistor according to the voltage ringing ranges.

2. The measuring system as claimed in claim 1, wherein the voltage ringing range is a voltage difference between a first sub-peak and a second sub-peak at the first terminal.

3. The measuring system as claimed in claim 1, wherein the detecting control system adjusts its resistance value so that a ratio of a first voltage ringing range to a second voltage ringing range is smaller than a specific value.

4. The measuring system as claimed in claim 3, wherein when the ratio is smaller than the specific value, the detecting control system detects whether leakage currents occur at a second terminal of the under test device.

5. The measuring system as claimed in claim 4, wherein when the detecting control system detects no leakage current at the under test device, the pulse generator increases voltage levels of the pulse signal until the detecting control system detects the leakage current flowed from the under test device.

6. The measuring system as claimed in claim 1, wherein the pulse generator comprises:
   a power supply for providing a dc voltage;
   a first transmission line with a characteristic impedance;
   a diode coupled between the first transmission line and a resistor;
   a second transmission line with the characteristic impedance; and
   a switch device comprising a first terminal coupled to the first transmission line and a second terminal and coupling the second terminal to the second transmission line or the power supply according to a switch signal.

7. The measuring system as claimed in claim 1, wherein the variable resistor is a voltage variable resistor.

8. The measuring system as claimed in claim 1, wherein the variable resistor and the under test device are coupled in parallel.

9. The measuring system as claimed in claim 1, wherein the measuring system is applied for a liquid crystal display.

10. A measuring method, comprising:
generating a pulse signal to an under test device and a variable resistor, wherein the variable resistor adjusted its resistance value according to a control signal;
detecting voltage ringing ranges of a first terminal of the under test device at the different resistance values;
generating the control signal to adjust the resistance values of the variable resistor according to the voltage ringing ranges so that a ratio of a first voltage ringing range to a second voltage ringing range is smaller than a specific value.

11. The measuring method as claimed in claim 10, wherein the voltage ringing range is a voltage difference between a first sub-peak and a second sub-peak at the first terminal.

12. The measuring method as claimed in claim 10, wherein when the ratio is smaller than the specific value, a detecting control system detects whether leakage currents occur at a second terminal of the under test device.

13. The measuring method as claimed in claim 12, wherein when the detecting control system detects no leakage current at the under test device, the pulse generator increases voltage levels of the pulse signal until the detecting control system detects the leakage current flowed from the under test device.

14. The measuring method as claimed in claim 10, wherein the variable resistor is a voltage variable resistor.

15. The measuring method as claimed in claim 10, wherein the variable resistor and the under test device are coupled in parallel.

16. The measuring method as claimed in claim 10, wherein the measuring method is applied for a liquid crystal display.

* * * * *